United States Patent [19]

Richard

[11] 4,262,219
[45] Apr. 14, 1981

[54] CIRCUIT FOR GENERATING PHASES TO CONTROL THE CARRYING OUT OF OPERATIONS IN A DATA PROCESSING SYSTEM

[75] Inventor: André Richard, La Celle Saint Cloud, France

[73] Assignee: Compagnie Internationale pour l'Informatique Cil Honeywell Bull (Societe Anonyme), Paris, France

[21] Appl. No.: 941,689

[22] Filed: Sep. 12, 1978

[30] Foreign Application Priority Data

Oct. 7, 1977 [FR] France ................................ 77 30299

[51] Int. Cl.³ ..................... H03K 5/135; H03K 17/16; H03K 17/26; H03K 17/693
[52] U.S. Cl. .................................... 307/262; 307/246; 307/DIG. 4; 307/571
[58] Field of Search ............... 307/208, 246, 251, 262, 307/270, 293, DIG. 1, DIG. 4

[56] References Cited

U.S. PATENT DOCUMENTS

| | | |
|---|---|---|
| 3,778,784 | 12/1973 | Karp et al. ........................ 307/262 X |
| 3,835,457 | 9/1974 | Yu ............................. 307/DIG. 4 X |
| 3,866,176 | 2/1975 | Baitinger et al. ......... 307/DIG. 4 X |
| 3,868,657 | 2/1975 | Hoffman et al. .......... 307/DIG. 4 X |
| 3,906,464 | 9/1975 | Lattin ......................... 307/DIG. 4 X |
| 3,964,030 | 6/1976 | Koo ............................ 307/DIG. 4 X |
| 4,021,656 | 5/1977 | Caudel et al. ............. 307/DIG. 4 X |
| 4,038,646 | 7/1977 | Mehta et al. .............. 307/DIG. 4 X |
| 4,061,933 | 12/1977 | Schroeder et al. .............. 307/270 X |
| 4,087,704 | 5/1978 | Mehta et al. ......................... 307/262 |

OTHER PUBLICATIONS

Cox et al., "An FET 4-Phase Dynamic Off-Chip Driver With Polarity Hold", IBM Tech. Discl. Bull., vol. 17, No. 2, pp. 466-467; 7/1974.

Primary Examiner—Larry N. Anagnos
Attorney, Agent, or Firm—Kerkam, Stowell, Kondracki & Clarke

[57] ABSTRACT

A control signal generating circuit is provided which is capable of activating its output in one of two modes depending on whether a transition occurs between the levels of one of the two voltages before or after a similar transition between levels occurs in the other voltage.

8 Claims, 3 Drawing Figures

CIRCUIT FOR GENERATING PHASES TO CONTROL THE CARRYING OUT OF OPERATIONS IN A DATA PROCESSING SYSTEM

BACKGROUND OF THE INVENTION

The present invention relates to circuits for generating a control signal to control the carrying out of operations in particular data transfer operations, in a data processing system.

In such systems, to allow data to be transferred between units or subassemblies (to control writing in a memory unit-to give a nonlimiting example) it is often useful to be able to generate a control signal for carrying out an operation when a first voltage with two levels changes from a given one of its levels to the other, only if a second voltage, also with two levels, has already changed from a given one of its levels to the other, and vice versa. One of these voltages may be periodic and the other non-periodic, or alternatively both the voltages may be non-periodic.

The object of the invention is to provide a control signal generating circuit which is capable of activating its output in one of two modes depending on whether a transition occurs between the levels of one of the two voltages before or after a similar transition between levels occurs in the other voltage.

SUMMARY OF THE INVENTION

In accordance with a feature of the invention, a control signal generating circuit comprises, in combination, an input stage having a first input means for receiving a first voltage exhibiting transitions between first and second levels and a second input means for receiving a second voltage exhibiting transitions between first and second levels, an output stage for a two level output, and means to combine the inputs and respond to transitions between levels in the voltages in respective given directions to activate the said output stage, which means are activated when one of these transitions in one of the voltages is preceded by the other of these transitions in the other of the voltages. The other of these transitions meaning the opposite type of transition, the transitions being either of the rising type which have an ending point higher in voltage level than a starting point or transitions of the falling type which have a starting point higher in voltage level than an ending point.

BRIEF DESCRIPTION OF THE DRAWINGS

In order that the invention may be more readily understood, reference will be made to the accompanying drawings, in which.

All the modifications which fall within the scope of the invention can be deduced simply from preferred embodiment of the invention as illustrated and its description; however, reference should be made to the appended claims which define the full scope of the invention.

DESCRIPTION OF THE PREFERRED EMBODIMENT

The circuit of the preferred embodiment is shown as being constructed from N channel metal oxide semiconductor (MOS) IC components. An N channel MOS device conducts when its gate goes positive.

Figure 1:
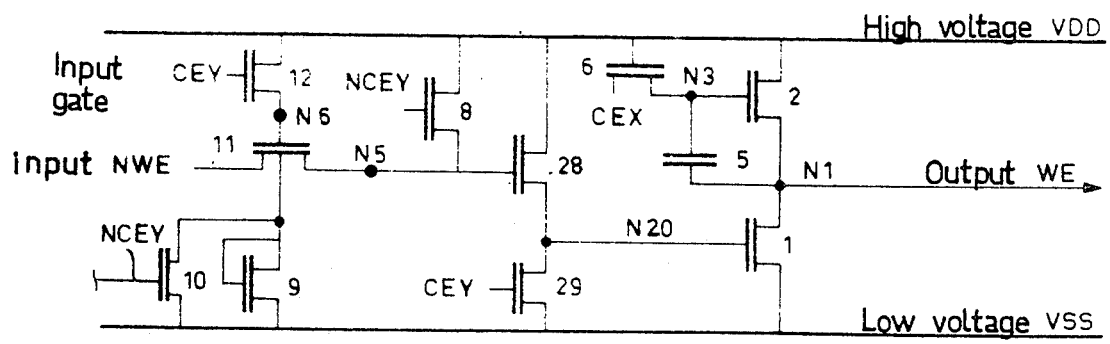
FIG. 1 shows a non-limiting embodiment of control signal generating circuit according to the present invention.

The circuit shown in FIG. 1 receives two input voltages, CEY and NWE, each on two levels. It has to respond to changes in level in these input voltages by raising its output WE, from point N1, to a high level when the following conditions are met at the two inputs for the input voltages:

NWE low, CEY rising from its low level to its high level (FIG. 2); and

CEY high, NWE falling from its high level to its low level (FIG. 3); a subsequent rising edge of NWE should then have no effect on the output level of WE even if this edge exceeds the initial high level.

Figure 2:
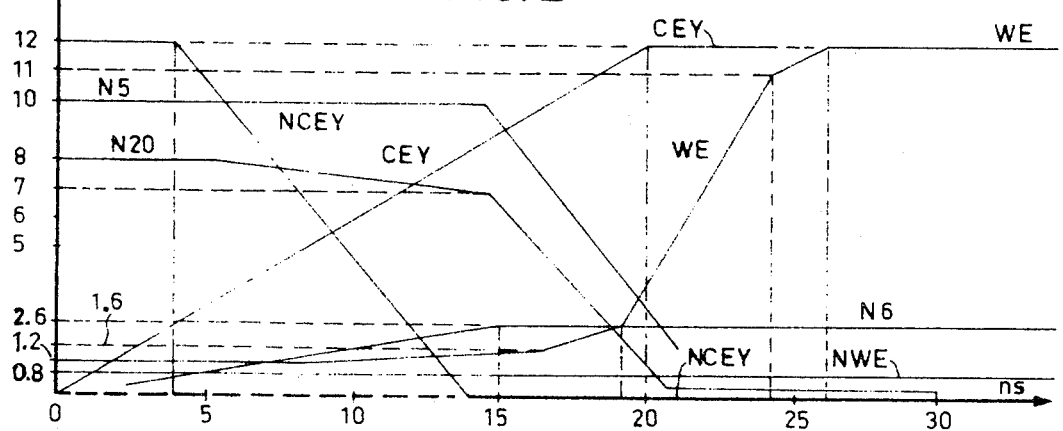
FIG. 2 is a graph illustrating the operation of the circuit of FIG. 1 when its output is activated in a first mode.

The input voltage CEY has two auxiliary control voltages associated with it:

A voltage NCEY which is high in the quiescent state and which drops, when CEY rises, to become zero, even before CEY has reached its high level (FIG. 2).

A voltage CEX which should be understood as anticipating any rise by CEY in order to apply a preliminary charge or potential to the output WE, as will be described below.

The change in voltage NWE may be in advance of the change in voltage CEY, in which case the rise in CEY occurs when voltage NWE is already at its low level. The change in NWE may alternatively lag with respect to the change in CEY, in which case CEY will already be at its high level when NWE drops from its high level to its low level. In both cases, namely, CEY changing from its low to its high level after NWE has undergone a transition from its high to its low level, and NWE changing from its high to its low level after CEY has undergone a transition from its low level to its high level, the output WE must be brought to its high level. If NWE drops when CEY is low, output WE should not be activated, i.e. raised to its high level. Similarly, if CEY rises when NWE is high, output WE should not be activated. In addition, a subsequent rise in NWE should not alter the state of output WE even if it occurs when CEY is high.

Figure 3:
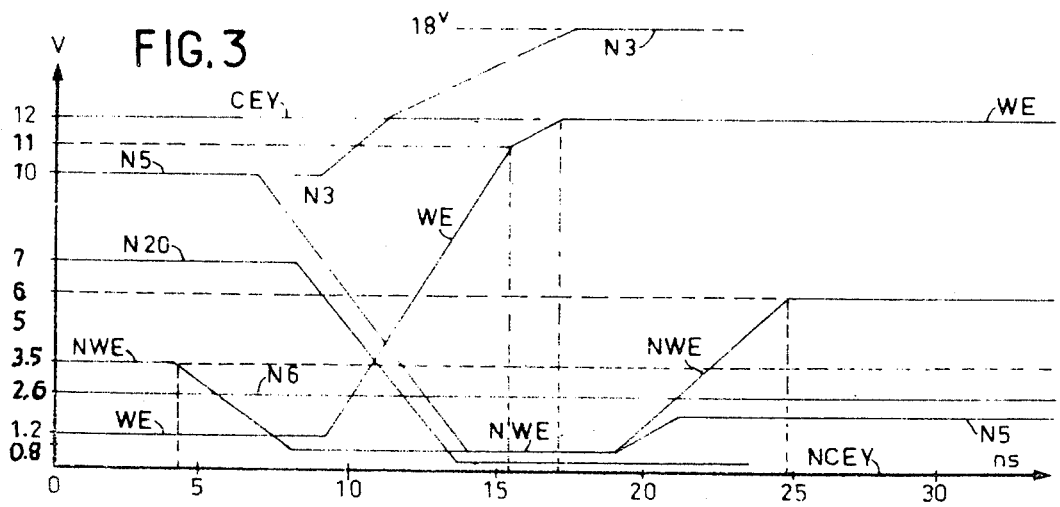
FIG. 3 is a graph illustrating the operation of the circuit of FIG. 1 when activation is in a second mode; and which also supplements the information given in FIG. 2 in respect of certain operating features common to the two modes.

To achieve the foregoing, the circuit is provided with an input stage which takes the form of a voltage divider between the high voltage VDD and low voltage VSS of the supply. This voltage divider includes a first input means comprising transistor 12 which receives voltage CEY at its gate. Voltage CEY may for example change from 0 to 12 volts, VDD being 12 volts. Connected to transistor 12 is an arm of the divider which comprises a transistor 9 connected as a diode in parallel with a transistor 10 which receives voltage NCEY at its gate. Point N6 of this voltage divider is connected to the gate of a transistor 11 which forms a second input means which receives the input voltage NWE. The characteristics of the components of the divider are so calculated that, when transistor 12 is conductive, the voltage at point N6 does not exceed a level of 2.6 volts for example, which corresponds to the minimum high conduction level of transistor 11 plus the conduction threshold for this transistor. When transistor 10 conducts, this point is at a low potential close to VSS. These conditions are indicated in FIGS. 3 and 2 respectively.

Transistor 11 has its drain functionally connected to the input to which voltage NWE is applied, and its source connected to a point N5 which, when NCEY is high and thus unblocks a transistor 8 connected between VDD and point N5 is raised to a potential VDD−VT, VT being the voltage drop through transistor 8, whereas NWE is high and transistor 11 is blocked.

Point N5 is connected to the gate of a transistor 28 which, in conjunction with a transistor 29 connected as a bridge between VDD and VSS, forms a follower stage which causes a voltage drop between point N5 and a point N20, and at the same time reduces the charging capacity or potential of the said point N5. Point N20 is connected to a gate of a transistor 1 which forms part of the output stage of the control signal generating circuit.

This transistor 1, which is connected to VSS, is one of the two components of a voltage inverter whose other component, a transistor 2, is connected to the high voltage VDD. The output WE is taken from the point N1 between transistors 1 and 2. Transistor 2 has its gate connected to a point N3 which is connected by a capacitor 5 to point N1. Point N3 receives a high voltage when a transistor 6 is conductive, the latter having its gate connected to VDD and its source connected to an input to which the previously mentioned voltage CEX is applied.

When the drain and source of transistor 11 are both above the previously mentioned high level at point N6, less a threshold, they are isolated from one another. They are also mutually isolated when point N6 is low, transistor 12 is blocked and voltage CEY is low.

When the circuit is in a state of general quiescence, point N5 is raised to a preliminary potential VDD−VT, of 10 volts for example. Point N20 is then at its high level, for example 8 volts. The input voltage CEX being low and transistor 6 conductive, transistor 2 is blocked and point N1 is at its low level, which is, for example, 0 volts or VSS. The potential of NWE is able to change with no effect on the circuit since CEY is low. Such a change from a low level to a high level and vice versa causes no change in the potential at point N6 as long as CEY is low, and the high potential at point N5 cannot change. Nor if CEY rises while NWE is high does anything happen at point N5. (See the two mutually isolated conditions of the drain and source of transistor 11 previously stated).

The relative characteristics of the transistors 28 and 29 in the follower stage are such that, when CEY rises and energizes transistor 29 while NWE is at its low level (FIG. 2), there is only a slight change in level at N20, for example from 8 volts to 7 volts, and the relative characteristics of transistors 1 and 2 are such that the level of the potential at point N1 then remains substantially low, for example in the neighborhood of 1.2 volts. The rise in CEY was preceded by a rise in CEX which closed the charging or potential-raising circuit to point N1 by unblocking transistor 2, with no appreciable change in the voltage at N1, since at this moment transistor 1 is conductive and thus shunts this charging or potential-raising current to voltage VSS. When CEY rises and NCEY drops, as shown in FIG. 2, since NWE is at its low level, the potential at point N5 is gradually reduced through transistor 11 to the low level at the NWE input which is of the order of 0.8 volts for example. The potential at point N20 drops in parallel with that at point N5. Transistor 1 is blocked. The potential at point N1 begins to rise again under the influence of the current flowing through transistor 2, which is conductive. The potential rise at point N1 is transmitted to N3 by the capacitor 5 so that point N1 continues to rise, rapidly in this case, to VDD while the potential at point N3 rises to a level above VDD to enable the potential at point N1 to rise to the latter level. As indicated in the graph in FIG. 3, the rise in potential at point N3 may, for example, be as much as 18 volts. This rise does of course occur both when the phase generator is activated in the first mode as is now being described, and also in the second mode. However, for the sake of clarity in the drawings, it is only shown in the graph of FIG. 3 and is omitted from FIG. 2.

Also shown in the graph of FIG. 3 is an eventuality which could occur with the first mode of activation once CEY is high and WE has been brought to its high level. The eventuality concerned is that in which NWE rises again once these conditions have been attained in the circuit. NCEY has not yet risen and point N6 has thus remained at the previously mentioned level of the order of 2.6 volts which it reached when NCEY fell and CEY rose (see FIG. 2). Thus, if NWE should rise again (FIG. 3) the level reached at point N5 remains less than that at N6 by a threshold amount as a result of the action of transistor 11. Since CEY is high, the follower circuit 28, 29 suffices to hold point N20 at a level lower than the conduction threshold of transistor 1.

In either case, the potential WE will only become low again upon the subsequent rise in voltage NCEY which accompanies a drop in voltage CEY. The level at points N5 and N20 rises again and transistor 1 again conducts.

The second mode of activation can be simply described. CEY having become high when NWE was high, in the neighborhood of 3.5 volts for example, point N5 became high and point N6 is at 2.6 volts and point N20 at 7 volts. The level at point N5 was raised to NCEY, the level at point N20 blocks transistor 1, and point 3 is at the level shown. When NWE falls, the level at point N5 drops through transistor 11 and the output level WE then rises again by the same process as described above.

It may be noted that the normal, high reference level for NWE is 3.5 volts, but that when it rises again under the control of means outside the scope of the invention, it is able to rise to approximately 6 volts, as is indicated on the right of FIG. 3, before returning to the above mentioned reference level.

I claim:

1. A control circuit connected across a high and a low voltage supply bus for generating a control signal to control the carrying out of operations in a data processing system, comprising, in combination:

an input stage having a first input means (12) for receiving a first voltage input signal (CEY) which changes between two voltage levels and a second input means (11) for receiving a second voltage input signal (NWE) which changes between two voltage levels, each of the first and second voltage input signals having two opposite types of transitions, transitions of a rising type having an ending point higher in voltage level than a starting point, and transitions of a falling type having a starting point higher in voltage level than an ending point;

connecting circuit means (N6, unnumbered conductors, transistors 9 and 10) for operatively interconnecting said first and second input means to each other and to the high and low voltage supply bus;

an output stage (transistors 1, 2, 6 and capacitor 5) connected across the high and low voltage supply bus and providing an output signal which shifts between two voltage levels;

and channel means (transistors 8, 28 and 29) for establishing a conductive channel between the input stage and the output stage;

whereby said channel means is operative to cause the output stage to shift the output signal whenever both conditions within either pair of the following requirements are met:

I.(1) a transition of a first type occurs in a particular one of said input signals and, (2) the other one of said input signals is at a level corresponding to its end point level after a transition of the opposite type, or, II.(1) a transition of the opposite type from said first type occurs in said other one of said input signals and (2) the particular one of said input signals is at a level corresponding to its endpoint level after a transition of the first type.

2. A control circuit as set forth in claim 1 wherein the channel means includes:

a means for raising the potential of a point on said conductive channel to a given potential, and a follower stage which outputs a potential which is reduced from the potential at said point, said follower stage being connected to an activating input of said output stage, and said input stage operates to inhibit conduction by said second input means as long as the first input signal remains at a first one of its two levels, a transition of the first input signal to a second one of its two levels resulting in the first input means unblocking the second input means to enable it to establish a discharge path to said point.

3. A control circuit as set forth in claim 1, wherein the said raising means includes a field effect transistor which connects the said point to the high voltage supply bus and said transistor having a gate connected to receive a voltage which varies in a manner substantially opposite to variations in said first input signal and being controlled by said varying received voltage.

4. A control circuit as set forth in claims 2 or 3 wherein the said follower stage comprises two transistors connected in series between the high and the low supply voltage buses, the transistor connected to the high voltage bus having a gate connected to the said point and the transistor connected to the low voltage bus having a gate controlled by the said first input signal, the junction between said two transistors being connected to the activating input of the output stage.

5. A control circuit as set forth in claim 4 wherein the output stage consists of an inverting circuit comprising a first transistor having a gate connected to said junction between said two transistors and a second transistor connected to the said high voltage supply bus, the gate of said second transistor being connected to the source/drain path of a third transistor having a gate connected to the high voltage supply bus, said third transistor being arranged to receive a control voltage whose transitions anticipate those of the first input signal, the output of the output stage being taken from a common point between the said first and the said second transistors and being fed back by a capacitive link to the gate of the second transistor.

6. A control circuit as set forth in claims 2 or 3 wherein, within the input stage, the first input means includes a field effect transistor connected to the high voltage bus and the second input means includes a field effect transistor, and said connecting circuit means includes at least one field effect transistor connected to the low voltage bus and forming a voltage divider with the field effect transistor of the first input means, the field effect transistor of the second input means having its gate connected to an intermediate point of said voltage divider.

7. A control circuit as set forth in claim 6 wherein, within the connection circuit means, the said at least one field effect transistor connected to the low voltage supply bus is connected as a diode and has a second field effect transistor connected in parallel therewith, said second field effect transistor having a gate connected to a voltage which varies in a manner substantially opposite to variations in the said first input signal.

8. A control circuit as set forth in claim 1 wherein there is no shift in the output signal whenever (A) the condition of I(1) occurs without the condition of I(2) being met, and there is no shift in the output signal whenever (B) the condition of II(1) occurs without the condition of II(2) being met.

* * * * *